US008351794B2

(12) United States Patent
Meadowcroft et al.

(10) Patent No.: US 8,351,794 B2
(45) Date of Patent: Jan. 8, 2013

(54) PARALLEL OPTICAL TRANSCEIVER MODULE HAVING A HEAT DISSIPATION SYSTEM THAT DISSIPATES HEAT AND PROTECTS COMPONENTS OF THE MODULE FROM PARTICULATES AND HANDLING

(75) Inventors: David Meadowcroft, San Jose, CA (US); Debo Adebiyi, Tracy, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 623 days.

(21) Appl. No.: 12/400,919

(22) Filed: Mar. 10, 2009

(65) Prior Publication Data

US 2010/0232800 A1 Sep. 16, 2010

(51) Int. Cl.
*H04B 10/04* (2006.01)
*H01L 33/64* (2010.01)
*H01L 23/495* (2006.01)

(52) U.S. Cl. .......... 398/139; 398/135; 398/136; 372/34; 372/36; 372/50.124; 438/26; 438/28; 257/675

(58) Field of Classification Search .............. 398/135, 398/136, 139; 372/34, 36, 50.124; 438/26, 438/28; 257/675, 717
See application file for complete search history.

(56) References Cited

U.S. PATENT DOCUMENTS

| | | | |
|---|---|---|---|
| 5,122,893 A * | 6/1992 | Tolbert .......................... 398/135 |
| 6,081,027 A | 6/2000 | Akram | |
| 6,404,048 B2 | 6/2002 | Akram | |
| 6,479,323 B1 | 11/2002 | Lo et al. | |
| 6,890,460 B2 * | 5/2005 | Huang .......................... 264/1.7 |
| 7,061,080 B2 | 6/2006 | Jeun et al. | |
| 7,245,813 B2 | 7/2007 | Brown et al. | |
| 7,841,777 B2 | 11/2010 | Howard et al. | |
| 2002/0003231 A1 * | 1/2002 | Sun et al. .......................... 257/59 |
| 2002/0196500 A1 * | 12/2002 | Cohen et al. ................... 359/152 |
| 2004/0071174 A1 * | 4/2004 | Takemori ......................... 372/43 |
| 2004/0126913 A1 * | 7/2004 | Loh ................................... 438/26 |
| 2005/0078720 A1 * | 4/2005 | Walker et al. ................... 372/36 |
| 2006/0285814 A1 | 12/2006 | Brown | |
| 2007/0131946 A1 * | 6/2007 | Spurlock et al. ................ 257/82 |
| 2009/0185778 A1 | 7/2009 | Howard | |
| 2010/0135618 A1 | 6/2010 | Howard et al. | |

OTHER PUBLICATIONS

ISOPLUS™—The Revolution in Discrete Isolation Technique IXAN0025, IXYS CorporationTechnical Application, Publication DE 0104E, Germany.

* cited by examiner

*Primary Examiner* — Jessica Stultz
*Assistant Examiner* — Michael Carter (57) ABSTRACT

A parallel optical transceiver module is provided that has a heat dissipation system that dissipates large amounts of heat, while also protecting the laser diodes, ICs and other components of the module from particulates, such as dust, for example, and from mechanical handling forces. The heat dissipation system is configured to be secured to the optical subassembly (OSA) of the module such that when the OSA is secured to the upper surface of the leadframe of the module, the OSA and the heat dissipation system cooperate to encapsulate at least the laser diodes and laser diode driver IC in a way that protects these components from dust and other particulates and from external mechanical forces. The heat dissipation system of the module is disposed for coupling with an external heat dissipation system, e.g., with a heat dissipation system that is provided by the customer.

21 Claims, 4 Drawing Sheets

PARALLEL OPTICAL TRANSCEIVER MODULE HAVING A HEAT DISSIPATION SYSTEM THAT DISSIPATES HEAT AND PROTECTS COMPONENTS OF THE MODULE FROM PARTICULATES AND HANDLING

TECHNICAL FIELD OF THE INVENTION

The invention relates to optical communications systems. More particularly, the invention relates to a parallel optical transceiver module having a heat dissipation system that provides improved heat dissipation while simultaneously protecting components of the module from particulates and external forces caused by mechanical handling of the module.

BACKGROUND OF THE INVENTION

Parallel optical transceiver modules typically include a plurality of laser diodes for generating optical data signals, laser diode driver circuitry for driving the laser diodes, a controller for controlling operations of the transceiver module, receiver photodiodes for receiving optical data signals, receiver circuitry for demodulating and decoding the received optical data signals, and monitor photodiodes for monitoring the output power levels of the laser diodes. Parallel optical transceiver modules typically also include an optical subassembly having optical elements that direct the optical data signals produced by the laser diodes onto the ends of optical fibers and that direct optical data signals received over optical fibers onto the receiver photodiodes.

The laser diode driver circuitry is typically contained in an integrated circuit (IC) having electrical contacts pads that are electrically coupled by electrical conductors (e.g., bond wires) to electrical contacts pads of the laser diodes. The number of laser diodes that are included in a parallel optical transceiver module depends on the design of the module. A typical parallel optical transceiver module may contain six laser diodes and six receiver photodiodes to provide six transmit channels and six receive channels. A typical parallel optical transceiver module that has no receiver photodiodes (i.e., an optical transmitter module) may have, for example, twelve laser diodes for providing twelve transmit channels. The laser diode driver ICs that are commonly used in these types of parallel optical transceiver or transmitter modules generate large amounts of heat that must be dissipated in order to prevent the laser diodes from being adversely affected by the heat. Due to the large amounts of heat generated, the tasks associated with designing and implementing a suitable heat dissipation system are challenging.

In addition, in a typical parallel optical transceiver or transmitter module, the laser diode driver IC is typically placed in very close proximity to the laser diodes to enable the bond wires that couple the contact pads of the laser diodes to the contact pads of the driver IC to be kept relatively short. Long bond wires can lead to electromagnetic coupling between adjacent bond wires that can degrade signal integrity, thereby detrimentally affecting the performance of the module. Placing the driver IC in close proximity to the laser diodes and using relatively short bond wires makes designing and implementing a suitable heat sink solution for the module even more challenging.

The heat dissipation systems used in existing parallel optical transceiver and transmitter modules typically comprise a heat sink structure that is mechanically and thermally coupled to a lower surface of a leadframe of the module. The laser diodes and laser diode driver IC are mounted on an upper surface of the leadframe. The coupling of the heat sink structure to the lower surface of the leadframe provides a thermal path for heat dissipation that is: from the laser diodes and driver IC down into the upper surface of the leadframe; from the upper surface of the leadframe through the leadframe to the lower surface of the leadframe; and then from the lower surface of the leadframe into the heat sink device secured thereto. The heat sink structure is typically a generally planar sheet of thermally conductive material, such as copper or aluminum. A thermally conductive material or device is used to secure the heat sink structure to the lower surface of the leadframe. As an alternative to using a generally planar heat sink structure secured to the lower surface of the leadframe, one or more heat sink devices may be coupled to other locations on the leadframe, such as to the side edges of the leadframe. In the latter case, heat that is transferred into the leadframe is transferred to the side edges of the leadframe and into the heat sink devices. In this type of arrangement, the leadframe functions in part as a heat spreader device to move heat generated by the laser diodes and laser diode driver IC away from those devices and then, via the heat sink devices coupled to the side edges of the leadframe, out of the leadframe.

One of the problems associated with the heat dissipation systems described above is that they do not protect the laser diodes and the laser diode driver IC from particulates, such as dust, for example. In fact, the process of securing the heat dissipation system to the leadframe may result in dust or other particulates being deposited on the laser diodes, which can degrade their performance. Additionally, some amount of handling typically occurs during the process of mounting the module on the PCB, which can lead to the laser diodes, the laser diode driver IC, bond wires, and other components of the module being damaged. Thus, while the customer's heat dissipation system may be effective at dissipating heat, it typically does not protect the laser diodes and ICs of the module from dust and other particulates or from mechanical handling forces that can damage these components.

Accordingly, a need exists for a parallel optical transceiver module having a heat dissipation system that is capable of dissipating large amounts of heat and that protects the laser diodes and other components of the module from particulates, such as dust, for example, and from mechanical handling forces.

SUMMARY OF THE INVENTION

The invention is directed to a heat dissipation method and to a parallel optical transceiver module having a heat dissipation system. The parallel optical transceiver module comprises an electrical subassembly (ESA), an optical subassembly (OSA), and a heat dissipation system. The ESA comprises a circuit board, a leadframe secured to the circuit board, at least one integrated circuit (IC) mounted on an upper surface of the leadframe, and a plurality of active optical devices mounted on the upper surface of the leadframe. The ESA and the OSA each have one or more alignment and interlocking features thereon for enabling the ESA and the OSA to be coupled together. The OSA has a plurality of optical elements for directing optical signals between ends of a plurality of optical fibers and the active optical devices mounted on the upper surface of the leadframe. The heat dissipation system is mechanically coupled with the OSA. The heat dissipation system comprises a material of high thermal conductivity and has at least one surface that is thermally coupled with the upper surface of the leadframe of the ESA when the OSA and the ESA are mechanically coupled with one another to enable heat to be transferred from the leadframe into the heat dissipation system. The heat dissipation system is configured to be thermally coupled with a heat dissipation system that is external to the parallel optical transceiver module to enable heat that is transferred from the leadframe into the heat dissipation system of the parallel optical transceiver module to be transferred into the external heat dissipation system.

The method comprises providing an ESA, providing an OSA, providing a heat dissipation system, mechanically coupling the heat dissipation system to the OSA, and mechanically coupling the OSA to the ESA. The heat dissipation system has at least one surface that is thermally coupled with the upper surface of the leadframe of the ESA when the OSA and the ESA are coupled together to enable heat to be transferred from the leadframe into the heat dissipation system. The heat dissipation system is configured to be thermally coupled with a heat dissipation system that is external to the parallel optical transceiver module to enable heat that is transferred from the leadframe into the heat dissipation system of the parallel optical transceiver module to be transferred into the external heat dissipation system.

These and other features and advantages of the invention will become apparent from the following description, drawings and claims.

DETAILED DESCRIPTION OF AN ILLUSTRATIVE EMBODIMENT

In accordance with the invention, a parallel optical transceiver module is provided that has a heat dissipation system that dissipates large amounts of heat, while also protecting the laser diodes, ICs and other components of the module from particulates, such as dust, for example, and from mechanical handling forces. The heat dissipation system is configured to be secured to the optical subassembly (OSA) of the module such that when the OSA is secured to the upper surface of the leadframe of the module, the OSA and the heat dissipation system cooperate to encapsulate at least the laser diodes and laser diode driver IC in a way that protects these components from dust and other particulates and from external mechanical forces. Parts of the heat dissipation system of the module are disposed to be coupled with an external heat dissipation system, e.g., with a heat dissipation system that is provided by the customer and that is placed in contact with the heat dissipation system of the module. Therefore, when the module is coupled with customer equipment, the heat dissipation system of the module interfaces with the customer's heat dissipation system, allowing heat to flow along a thermal path that is from the laser diodes and laser diode driver IC into the leadframe of the module, from the leadframe of the module into the heat dissipation system of the module, and from the heat dissipation system of the module into the customer's heat dissipation system.

Figure 1:
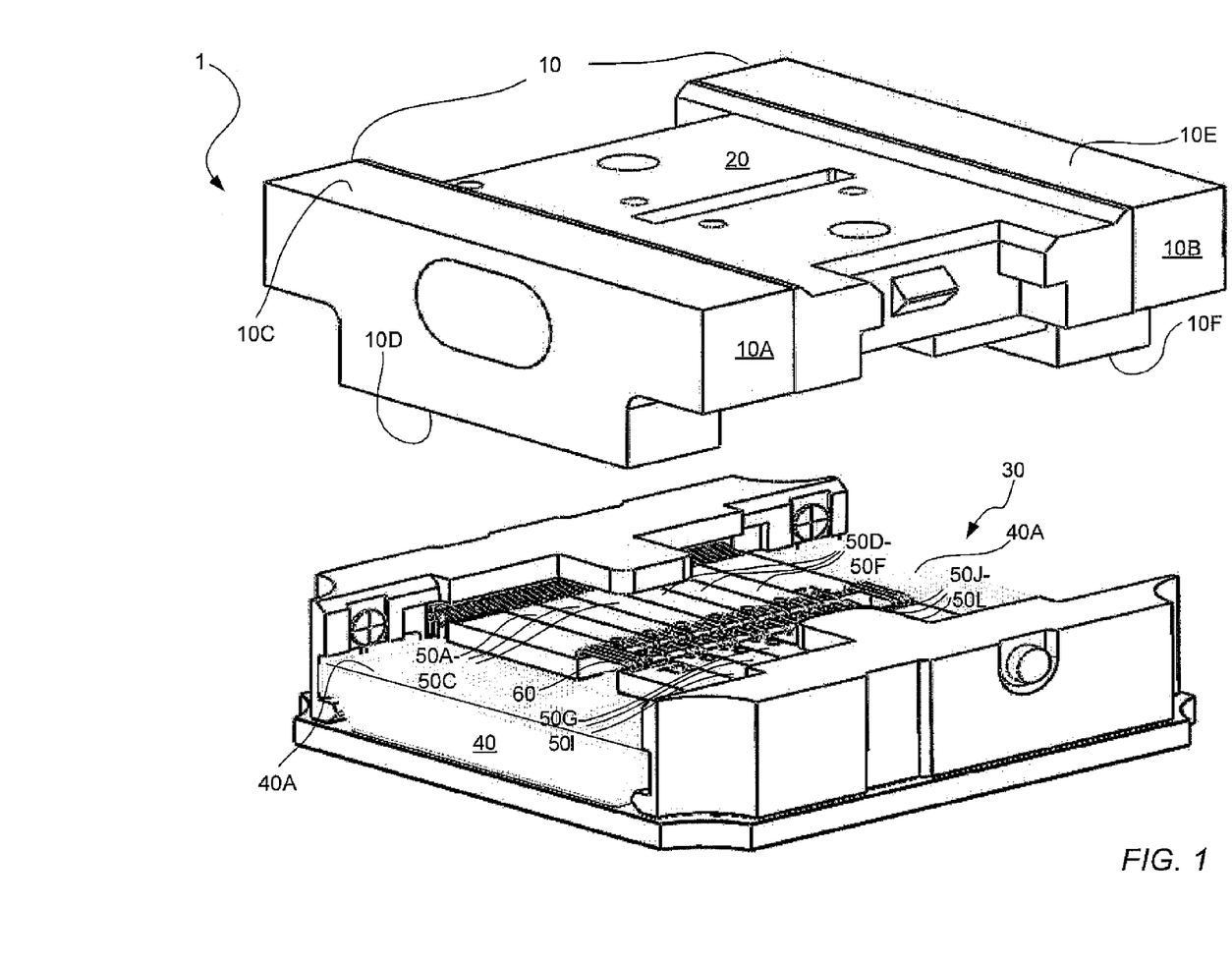
FIG. 1 illustrates a perspective view of a parallel optical transceiver module in accordance with an embodiment, which shows the heat dissipation system secured to the optical subassembly prior to the combined heat dissipation system and optical subassembly being secured to the portion of the transceiver module that houses the electrical subassembly of the transceiver module.

FIG. 1 illustrates a perspective view of a parallel optical transceiver module 1 in accordance with an embodiment, which includes an embodiment of the heat dissipation system 10 that is secured to the OSA 20 of the parallel optical transceiver module 1. The parallel optical transceiver module 1 also includes an electrical subassembly (ESA) 30 that is configured to be mechanically coupled to the heat dissipation system 10 and the OSA 20. The heat dissipation system 10 and the OSA 20 are each configured to mechanically couple to each other. The heat dissipation system 10 in accordance with this embodiment includes heat blocks 10A and 10B that are mechanically coupled to the sides of the OSA 20 as shown in FIG. 1. The heat block 10A has an upper surface 10C and a lower surface 10D. Likewise, the heat block 10B has an upper surface 10E and a lower surface 10F.

The ESA 30 includes a leadframe 40 having an upper surface 40A on which a plurality of laser diode driver ICs 50A-50L are mounted. An array of laser diodes 60 is also mounted on the upper surface of the leadframe 40. In accordance with this illustrative embodiment, the module 1 includes twelve laser diodes for producing twelve optical data signals. When the OSA 20 having the heat dissipation system 10 secured thereto is attached to the ESA 30, the lower surfaces 10D and 10F of the heat blocks 10A and 10B, respectively, are in contact with the upper surface 40A of the leadframe 40, as will be described below with reference to FIG. 2. The OSA 20 is configured to receive an optical connector (not shown) that terminates an end of a twelve-fiber ribbon cable (not shown). The OSA 20 includes optical elements (not shown) for directing light produced by the twelve laser diodes onto the respective ends of twelve respective optical fibers of the ribbon cable.

Figure 2:
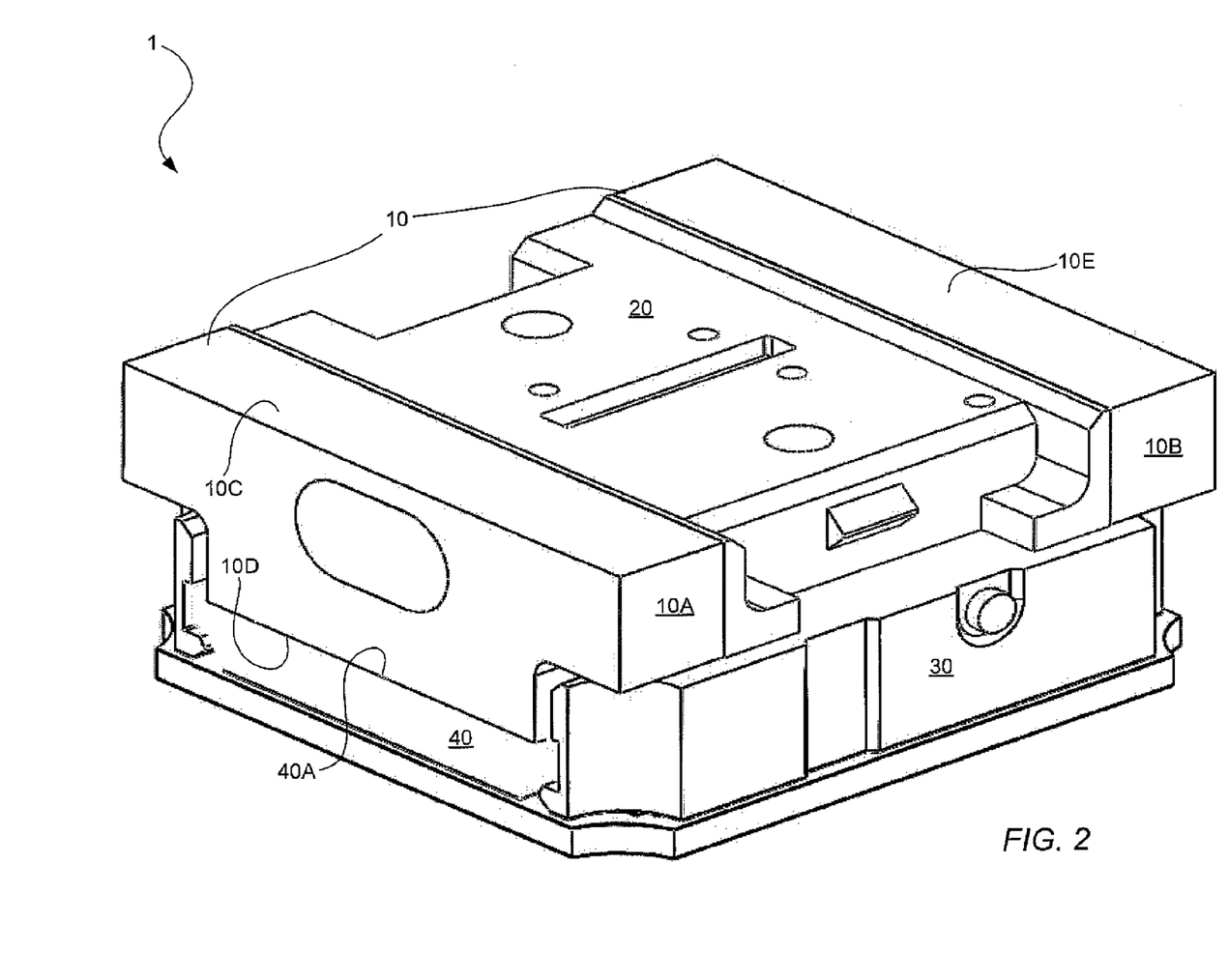
FIG. 2 illustrates a perspective view of the parallel optical transceiver module shown in FIG. 1, which shows the heat dissipation system secured to the optical subassembly, and the combination of the heat dissipation system and the optical subassembly secured to the portion of the transceiver module that houses the electrical subassembly of the transceiver module.

FIG. 2 illustrates a perspective view of the parallel optical transceiver module 1, which shows the heat dissipation system 10 secured to the OSA 20, and the combination of the heat dissipation system 10 and the OSA 20 secured to the ESA 30. In FIG. 2, the lower surfaces 10D and 10F of the heat blocks 10A and 10B, respectively, are shown in contact with the upper surface 40A of the leadframe 40. Typically, a thermally conductive attachment material, such as a thermally conductive epoxy, for example, is used to secure the lower surfaces 10D and 10F of the heat blocks 10A and 10B, respectively, to the upper surface 40A of the leadframe 40. It can be seen in FIG. 2 that the combination of the heat dissipation system 10 and of the OSA 20 encapsulates the electrical circuitry mounted on the upper surface 40A of the leadframe 40. This encapsulation of the electrical circuitry (e.g., the laser diodes and laser diode driver IC) mounted on the leadframe 40 protects the electrical circuitry from dust and other particulates and from forces resulting from mechanical handling of the transceiver module 1. The encapsulation may be a semi-hermetic seal or it may be a seal having small openings (e.g., 1 to 200 micrometers in size) in it, but that is still effective at blocking dust and other particulates and at preventing moisture condensation from occurring inside of the seal.

Figure 3:
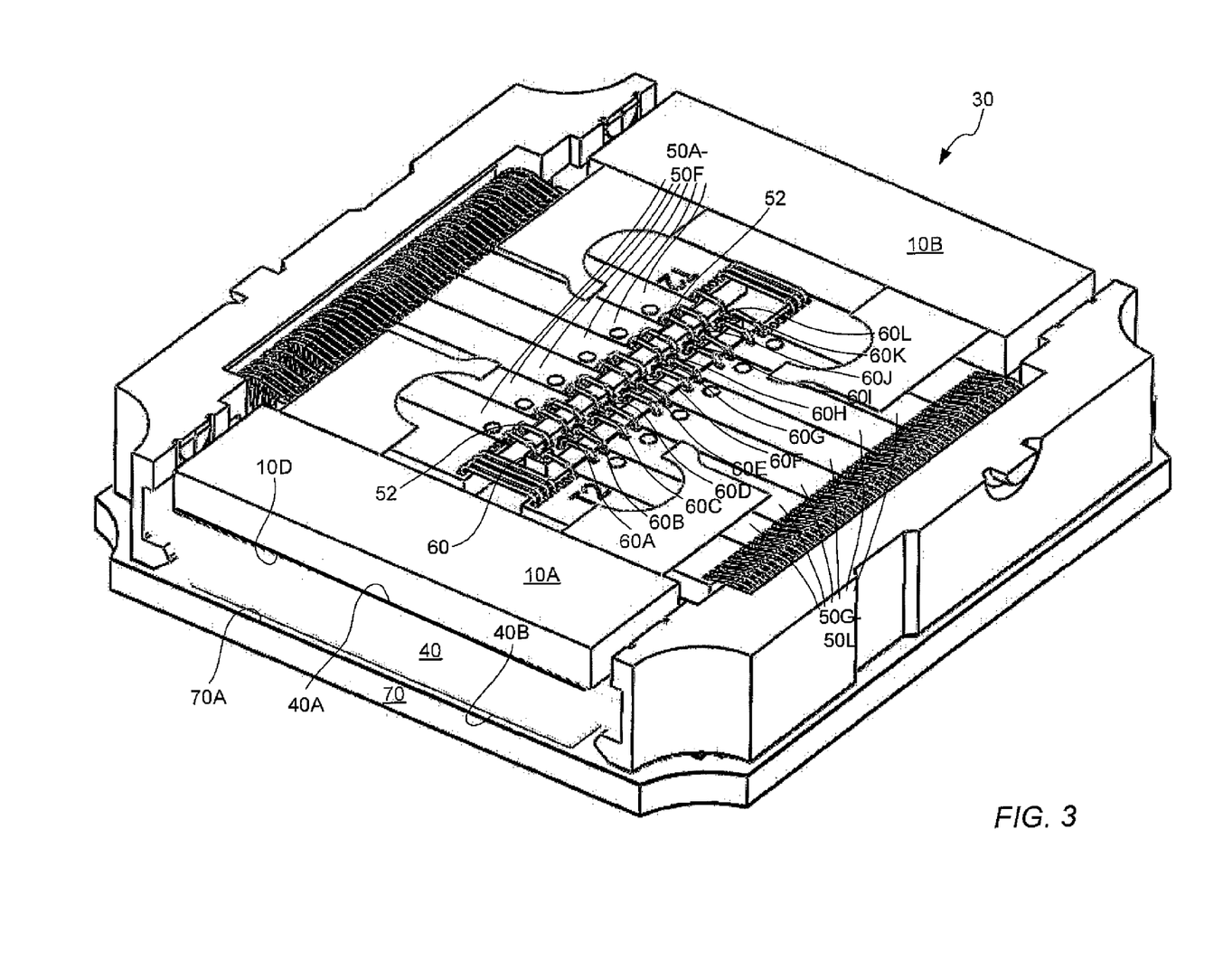
FIG. 3 illustrates a perspective view of the parallel optical transceiver module shown in FIG. 2, which shows the lower surfaces of the heat blocks of the heat dissipation system secured to the upper surface of the leadframe of the optical transceiver module.

FIG. 3 illustrates a perspective view of the parallel optical transceiver module 1 that shows the lower surfaces 10D and 10F of the heat blocks 10A and 10B, respectively, secured to the upper surface 40A of the leadframe 40, but the upper portions of the heat blocks 10A and 10B and the OSA 20 (FIGS. 1 and 2) have been removed to enable the electrical circuitry mounted on the upper surface 40A of the leadframe 40 to be more clearly seen. In accordance with this illustrative embodiment, the parallel optical transceiver module 1 has only transmitter functionality and does not include receiver functionality. The module 1 includes twelve laser diode driver ICs 50A-50L and twelve laser diodes 60A-60L to provide twelve transmit channels. The laser diode driver ICs 50A-50L have driver pads (not shown) that are electrically coupled by wire bonds 52 to contact pads (not shown) of the laser diodes 60A-60L for delivering electrical signals to the laser diodes 60A-60L, such as the laser diode bias and modulation current signals. The laser diodes 60A-60L are typically vertical cavity surface emitting laser diodes (VCSELs) and may be integrated as an array into a single IC 60. The parallel optical transceiver module 1 also includes a circuit board 70, which is typically a ball grid array (BGA), a land grid array (LGA), or the like. The lower surface 40B of the leadframe 40 is secured to the upper surface 70A of the circuit board 70.

It should be noted that the invention is not limited with respect to the configuration of the ESA 30. Although the module 1 shown in FIGS. 1-3 comprises only transmitter functionality, it could also include receiver functionality. The term "transceiver module", as that term is used herein, is intended to denote any of the following: (1) a module configured to transmit and receive signals, (2) a module configured to transmit signals, but not receive signals, and (3) a module configured to receive signals, but not transmit signals. The transceiver module described herein with reference to the illustrative embodiment is configured to transmit, but not receive, signals. Therefore, the transceiver module in accordance with this illustrative embodiment may also be thought of as a transmitter, or Tx, module as it has no receiver capability or functionality. It should be noted, however, that the transceiver module of the invention may instead be configured to receive, but not transmit, signals, in which case the module may be thought of as a receiver module, or Rx module. The transceiver module of the invention may also be configured to transmit and receive signals. The term "active optical device", as that term is used herein, is intended to denote a light emitting device, such as a laser diode, for example, and to denote a light sensing device, such as a photodiode, for example.

One of the reasons for providing the optical transceiver module 1 with a heat dissipation system 10 that attaches to the upper surface 40A of the leadframe 40 is that the module 1 produces such a large amount of heat that attaching a heat dissipation system to the lower surface of the leadframe, as is typically done in known optical transceiver modules, would not provide an effective heat dissipation solution. The module 1 may be, for example, eight millimeters (mm) by eight mm in width and length and approximately 3.5 mm in height. Because there are so many laser diodes and laser diode driver circuits in this small area, the amount of heat that is must be dissipated is very large. Also, because the circuit board 70 of the module is typically a BGA, a LGA, or the like, it is impossible or unfeasible to attach the heat dissipation system to the lower surface of the leadframe 40.

Another reason for providing the optical transceiver module 1 with a heat dissipation system 10 that couples to the upper surface 40A of the leadframe 40 is to achieve the aforementioned goals of protecting the laser diode driver circuitry 50A-50L and the laser diodes 60A-60L from particulates, such as dust, and from mechanical handling forces. Particulates in the air can become deposited on the laser diodes 60A-60L, causing their performance to be degraded. Mechanical forces that are exerted on these components during handling can damage these components, causing their performance to be adversely affected. The combined heat dissipation system 10 and OSA 20, when secured to the ESA 30, provide protection against these environmental factors.

Figure 4:
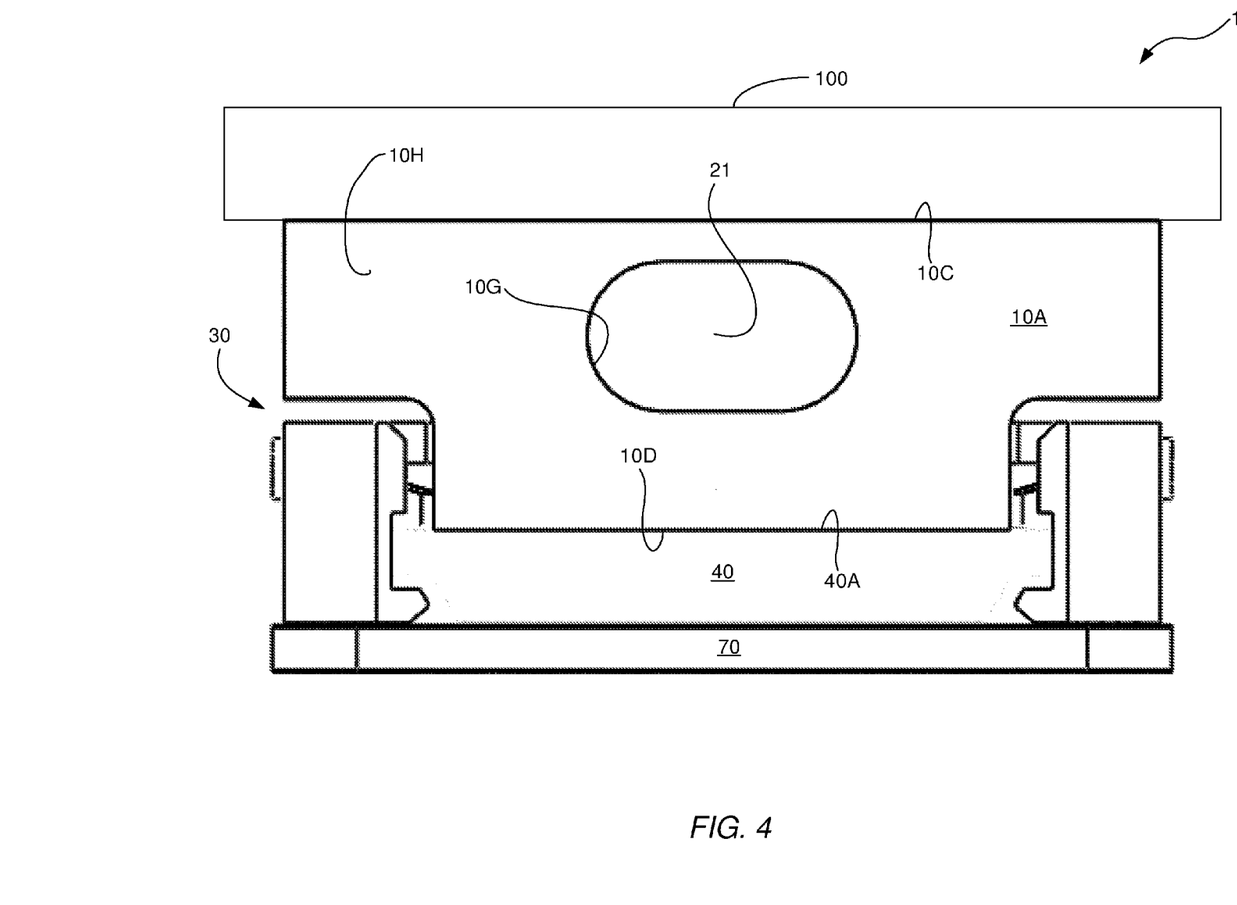
FIG. 4 illustrates a left side plan view of the parallel optical transceiver module shown in FIGS. 1-3.

FIG. 4 illustrates a left side plan view of the parallel optical transceiver module 1 shown in FIGS. 1-3 in which the upper surfaces 10C and 10E of the heat blocks 10A and 10B, respectively, are shown mechanically and thermally coupled with an external heat dissipation system 100. As indicated above, the external heat dissipation system is typically provided by the customer. The right side plan view (not shown) of the module 1 is identical to the left side plan view shown in FIG. 4. Each of the heat blocks 10A and 10B has an elongated opening 10G formed in it. To secure the heat blocks 10A and 10B to the OSA 20 (FIGS. 1 and 2), a molding tool and process are used. The mold tool has a first cavity in it that is shaped to form the OSA and second and third cavities on opposite sides of the first cavity that are shaped to receive the heat blocks 10A and 10B. The heat blocks 10A and 10B are placed into the second and third cavities and then the mold tool is closed. Molten plastic is then injected into the mold tool to fill the first cavity having the shape of the OSA 20. The molten plastic fills the first cavity and flows into the openings 10G formed in the heat blocks 10A and 10B. After the plastic has been injected into the mold tool, the plastic cools rapidly, causing it to contract and harden. When the plastic contracts and hardens, it grips the surfaces of the openings 10G formed in the blocks 10A and 10B, securing them firmly to the molded plastic of the OSA 20. Reference numeral 21 is used in FIG. 4 to represent the portions of the liquid plastic that flows into the openings 10G. Of course, other mechanisms could be used to secure the heat blocks 10A and 10B to the OSA 20, such as epoxy or mechanical interlocking features.

The OSA 20 (FIGS. 1 and 2) and the ESA 30 have alignment and locking features thereon (not shown) that align and interlock the OSA 20 and the ESA 30 to each other when they are coupled together. In this coupled state, the lower surfaces 10D (FIG. 4) and 10F (FIG. 1) of the heat blocks 10A (FIG. 4) and 10B (FIG. 1), respectively, are in contact with the upper surface 40A of the leadframe 40 (FIG. 4). A variety of configurations of suitable alignment and locking features can be designed for mechanically aligning and interlocking the OSA 20 and the ESA 30 together, as will be understood by persons of ordinary skill in the art. Therefore, in the interest of brevity, a detailed discussion of the alignment and locking features will not be provided herein.

The primary thermal path for heat dissipation will now be described with reference to FIGS. 2-4. The thermal path for heat produced by the laser diode driver ICs 50A-50L (FIGS. 2 and 3) and the laser diode array 60 (FIG. 3) is as follows: from the laser diode driver ICs 50A-50L and from the laser diode array 60 down into the leadframe 40; from the upper surface 40A of the leadframe 40 up into the lower surfaces 10D and 10F of the heat blocks 10A and 10B, respectively; from the lower surfaces 10D and 10F of the heat blocks 10A and 10B to the upper surfaces 10C and 10E of the heat blocks 10A and 10B, respectively; and then from the upper surfaces 10C and 10E of the heat blocks 10A and 10B, respectively, into the customer's heat dissipation system (not shown).

The heat blocks 10A and 10B of the heat dissipation system 10 may be made of any thermally conductive material, such as copper, for example. In accordance with an embodiment, the heat blocks 10A and 10B are formed using a conventional blank stamping process. The blocks 10A and 10B are then nickel plated, which prevents the copper from oxidizing and prevents the copper atoms from migrating into the laser diodes 60A-60L. Other materials, such as aluminum nitride, for example, may also be used for the heat blocks 10A and 10B. An advantage to using copper for the heat blocks 10A and 10B is that the coefficient of thermal expansion (CTE) of copper is approximately the same as the CTE of the plastic material that will typically be used for the OSA 20.

It should be noted that the invention is not limited with respect to the shapes of the heat blocks 10A and 10B or with respect to the manner in which the heat blocks 10A and 10B are secured to the OSA 20. For example, rather than using the elongated openings 10G and the plastic 21 described above with reference to FIG. 4 to mechanically couple the blocks 10A and 10B to the OSA 20, the blocks 10A and 10B may have cutaway regions formed on their ends that are adapted to mate with complementary features on the sides of the OSA 20 when the blocks 10A and 10B are coupled to the sides of the OSA 20. As will be understood by persons of ordinary skill in the art, the blocks 10A and 10B and the OSA 20 may be designed in a number of different ways to enable the blocks 10A and 10B to be secured to the OSA 20 in a suitable manner. Although the heat blocks 10A and 10B are shown as having particular shapes, the invention is not limited to any particular shapes for the heat blocks. A variety of different designs and configurations may be used for the heat blocks. However, the design and configuration that is chosen should be one that couples the heat blocks to the OSA in such a way that the lower surfaces of the heat blocks are in good contact with the leadframe of the transceiver module when the OSA is secured to the ESA of the transceiver module. The upper surfaces of the heat blocks should be disposed so that they can be easily coupled to the customer's heat dissipation system.

In addition to the heat dissipation system 10 described above with reference to FIGS. 1-4 having the aforementioned advantages of protecting the laser diode driver ICs 50A-50L and the laser diodes 60A-60L from particulates and mechanical handling forces, the heat dissipation system 10 provides other advantages. One additional advantage of the heat dissipation system 10 is that it provides the customer with additional flexibility in implementing an appropriate thermal interface solution for coupling the customer's heat dissipation system (not shown) to the heat dissipation system 10 of the transceiver module 1. In current designs provided by the assignee of the present application in which the customer's heat dissipation system is required to couple directly to the leadframe of the parallel optical transceiver module, the customer has been limited with regard to the type of thermal interface solution that may be used for this purpose. For example, a re-workable interface solution (i.e., one that may require mating and de-mating) that includes indium could create particulates (i.e., indium flakes) that could adversely affect the performance of the laser diodes. In accordance with the invention, because the customer's heat dissipation system couples to the heat dissipation system 10 of the module 1 rather than directly to the leadframe 40, re-working (e.g., mating and/or de-mating) of a thermal interface will not affect the laser diode driver ICs 50A-50L or the laser diodes 60A-60L due to the fact that they are protected by the combination of the heat blocks 10A and 10B and the OSA 20. This feature of the invention provides the customer with great flexibility in designing and implementing the customer's heat dissipation system and interface solution. In addition to all of these advantages, the heat dissipation system 10 of the module 1 provides the module 1 with convection cooling surfaces that further improve heat dissipation. With reference again to FIG. 4, the side surfaces 10H of the heat blocks 10A and 10B provide additional cooling surface areas for convection cooling in cases where the module 1 is used in a convection cooling environment.

Although the parallel optical transceiver module 1 has been described as a Tx module having twelve transmit channels, the same arrangement for the OSA 20 and heat blocks 10A and 10B is intended for use when the module 1 is configured as an Rx module having twelve receive channels. In the latter case, the ESA 30 would include the leadframe 30, twelve receive photodiodes (not shown) and one or more receiver ICs mounted on the leadframe 30. The OSA 20 will be essentially the same as that shown in FIGS. 1, 2 and 4 and described above, except that the optical elements (not shown) of the OSA 20 will be configured to receive light from twelve receive optical fibers (not shown) of a twelve-ribbon fiber cable and direct the received light onto respective ones of the twelve receive photodiodes (not shown). As stated above, however, the parallel optical transceiver module of the invention is not limited with respect to the number of transmit and/or receive channels that are provided in the transceiver module.

It should be noted that the invention has been described with respect to illustrative embodiments for the purpose of describing the principles and concepts of the invention. The invention is not limited to these embodiments. As will be understood by those skilled in the art in view of the description being provided herein, many modifications may be made to the embodiments described herein while still providing a parallel optical transceiver module that achieves the goals of the invention, and all such modifications are within the scope of the invention.

What is claimed is:

1. A parallel optical transceiver module comprising:
    an electrical subassembly (ESA) comprising a circuit board, a leadframe secured to the circuit board, at least one integrated circuit (IC) mounted on an upper surface of the leadframe, and a plurality of active optical devices mounted on the upper surface of the leadframe, the ESA having one or more alignment and interlocking features thereon;
    an optical subassembly (OSA) mechanically coupled with the ESA, the OSA having a plurality of optical elements for directing optical signals between ends of a plurality of optical fibers and the active optical devices mounted on the upper surface of the leadframe, the OSA having one or more alignment and interlocking features configured to be aligned and interlocked with the alignment and interlocking features of the ESA to enable the OSA and the ESA to be mechanically coupled with one another; and
    a heat dissipation system mechanical coupled to the OSA, the heat dissipation system comprising a material of high thermal conductivity, the heat dissipation system comprising at least first and second heat blocks, the first and second heat blocks having respective mating features that mate with respective mating features of the OSA to mechanically couple the first and second heat blocks to first and second sides, respectively, of the OSA, wherein the first and second heat blocks have lower surfaces that are thermally coupled with the upper surface of the leadframe of the ESA, and wherein the first and second heat blocks have upper surfaces that are disposed above an upper surface of the OSA and are open and uncovered to enable the upper surfaces of the heat blocks to be thermally coupled with a heat dissipation system that is external to the parallel optical transceiver module to enable heat that is transferred from the leadframe into the heat dissipation system of the parallel optical transceiver module to be transferred into the external heat dissipation system, and wherein the mechanical coupling together of the ESA and the OSA and the mechanical coupling together of the heat dissipation system and the OSA provide an encapsulation for said plurality of active optical devices and said at least one IC that protects said plurality of active optical devices and said at least one IC from particulates and mechanical handling forces.

2. The parallel optical transceiver module of claim 1, wherein said plurality of active optical devices correspond to a plurality of laser diodes, and wherein said at least one IC includes a plurality of laser diode driver ICs for driving respective ones of the laser diodes.

3. The parallel optical transceiver module of claim 1, wherein said plurality of active optical devices correspond to a plurality of photodiodes, and wherein said at least one IC includes a receiver IC.

4. The parallel optical transceiver module of claim 1, wherein said plurality of active optical devices include a plurality of laser diodes and a plurality of photodiodes, and wherein said at least one IC includes at least one laser diode driver IC for driving the laser diodes and at least one receiver IC for receiving and processing electrical signals produced by the photodiodes.

5. The parallel optical transceiver module of claim 1, wherein the lower surfaces of the first and second heat blocks are thermally coupled with the upper surface of the leadframe of the ESA by a thermally conductive epoxy.

6. The parallel optical transceiver module of claim 1, wherein the respective mating features of the OSA that mate with the respective mating features of the first and second heat blocks are disposed on the first and second sides of the OSA, and wherein the first and second sides of the OSA to which the first and second heat blocks are coupled are opposite one another such that the first and second heat blocks are opposite one another when coupled to the OSA.

7. The parallel optical transceiver module of claim 1, wherein the first and second heat blocks comprise copper.

8. The parallel optical transceiver module of claim 1, wherein the first and second heat blocks comprise aluminum.

9. The parallel optical transceiver module of claim 1, wherein the respective mating features of the OSA are first and second portions of plastic that are formed during a molding process that is used to mold a housing of the OSA.

10. The parallel optical transceiver module of claim 9, wherein the first and second heat blocks having first and second openings, respectively, formed therein, and wherein the first and second portions of the plastic are portions of plastic that flow into the first and second openings during the molding process and subsequently harden when the plastic cools.

11. A method for dissipating heat in a parallel optical transceiver module, the method comprising:
providing an electrical subassembly (ESA) comprising a circuit board, a leadframe secured to the circuit board, at least one integrated circuit (IC) mounted on an upper surface of the leadframe, and a plurality of active optical devices mounted on the upper surface of the leadframe;
providing an optical subassembly (OSA) having a plurality of optical elements for directing optical signals between ends of a plurality of optical fibers and the active optical devices mounted on the upper surface of the leadframe;
providing a heat dissipation system comprising a thermally conductive material, the heat dissipation system being configured to be mechanically coupled to the OSA;
mechanically coupling the heat dissipation system to the OSA; and
mechanically coupling the OSA to the ESA, wherein the heat dissipation system comprises at least first and second heat blocks, the first and second heat blocks having respective mating features that mate with respective mating features of the OSA to mechanically couple the first and second heat blocks to first and second sides, respectively, of the OSA, wherein the first and second heat blocks have lower surfaces that are thermally coupled with the upper surface of the leadframe of the ESA, and wherein the first and second heat blocks have upper surfaces that are disposed above an upper surface of the OSA and are open and uncovered to enable the upper surfaces to be thermally coupled with a heat dissipation system that is external to the parallel optical transceiver module to enable heat that is transferred from the leadframe into the heat dissipation system of the parallel optical transceiver module to be transferred into the external heat dissipation system, and wherein the mechanical coupling together of the ESA and the OSA and the mechanical coupling together of the heat dissipation system and the OSA provide an encapsulation for said plurality of active optical devices and said at least one IC that protects said plurality of active optical devices and said at least one IC from particulates and mechanical handling forces.

12. The method of claim 11, further comprising:
thermally coupling the heat dissipation system of the parallel optical transceiver module to an external heat dissipation system to enable heat to be transferred into the external heat dissipation system from the heat dissipation system of the parallel optical transceiver module.

13. The method of claim 11, wherein said plurality of active optical devices correspond to a plurality of laser diodes, and wherein said at least one IC includes a plurality of laser diode driver ICs for driving respective ones of the laser diodes.

14. The method of claim 11, wherein said plurality of active optical devices correspond to a plurality of photodiodes, and wherein said at least one IC includes a receiver IC.

15. The method of claim 11, wherein said plurality of active optical devices include a plurality of laser diodes and a plurality of photodiodes, and wherein said at least one IC includes at least one laser diode driver IC for driving the laser diodes and at least one receiver IC for receiving and processing electrical signals produced by the photodiodes.

16. The method of claim 11, wherein the lower surfaces of the first and second heat blocks are thermally coupled with the upper surface of the leadframe of the ESA by a thermally conductive epoxy.

17. The method of claim 11, wherein the respective mating features of the OSA that mate with the respective mating features of the first and second heat blocks are disposed on the first and second sides of the OSA, and wherein the first and second sides of the OSA to which the first and second heat blocks are coupled are opposite one another such that the first and second heat blocks are opposite one another when coupled to the OSA.

18. The method of claim 11, wherein the first and second heat blocks comprise copper.

19. The method of claim 11, wherein the first and second heat blocks comprise aluminum.

20. The method of claim 11, wherein the respective mating features of the OSA are first and second portions of plastic that are formed during a molding process that is used to mold a housing of the OSA.

21. The method of claim 20, wherein the first and second heat blocks have first and second openings, respectively, formed therein, and wherein the first and second portions of the plastic are portions of plastic that flow into the first and second openings during the molding process and subsequently harden when the plastic cools.

* * * * *